United States Patent [19]

Benjauthrit

[11] Patent Number: 5,341,134
[45] Date of Patent: Aug. 23, 1994

[54] SIMPLE CODING SCHEME FOR DC FREE CHANNEL CODES OF FORM M/N, WHERE M=N−1 AND M AND N ARE POSITIVE INTEGERS

[75] Inventor: Boonsieng Benjauthrit, La Canada, Calif.

[73] Assignee: Datatape Incorporated, Pasadena, Calif.

[21] Appl. No.: 998,695

[22] Filed: Dec. 30, 1992

[51] Int. Cl.5 .............................................. H03M 7/20
[52] U.S. Cl. ........................................ 341/58; 341/102
[58] Field of Search ....................... 341/58, 55, 63, 67, 341/95, 106

[56] References Cited

U.S. PATENT DOCUMENTS

| | | |
|---|---|---|
| 3,631,471 | 12/1971 | Griffiths . |
| 4,387,364 | 6/1983 | Shirota . |
| 4,499,454 | 2/1985 | Shimada . |
| 4,500,871 | 2/1985 | Ratigalas . |
| 4,523,181 | 6/1985 | Tazaki et al. . |
| 4,620,311 | 10/1986 | Immink . |
| 4,675,650 | 6/1987 | Coppersmith et al. . |
| 4,731,797 | 3/1988 | Jaffre et al. . |
| 4,988,999 | 1/1991 | Kyokai . |
| 5,008,669 | 4/1991 | Ishibashi et al. . |
| 5,016,258 | 5/1991 | Tanaka et al. . |

*Primary Examiner*—Brian K. Young
*Attorney, Agent, or Firm*—William F. Noval

[57] ABSTRACT

Digital data recording/reproducing apparatus which uses a simple coding scheme for DC channel codes of the form M/N where M=N−1 and M and N are positive integers.

4 Claims, 22 Drawing Sheets

| NUMBER OF ONES | NUMBER OF ZEROS | NUMBER OF CODEWORDS | CDS |
|---|---|---|---|
| 0 | 12 | 1 | −12 |
| 1 | 11 | 12 | −10 |
| 2 | 10 | 66 | −8 |
| 3 | 9 | 220 | −6 |
| 4 | 8 | 495 | −4 |
| 5 | 7 | 792 | −2 |
| 6 | 6 | 924 | 0 |
| 7 | 5 | 792 | +2 |
| 8 | 4 | 495 | +4 |
| 9 | 3 | 220 | +6 |
| 10 | 2 | 66 | +8 |
| 11 | 1 | 12 | +10 |
| 12 | 0 | 1 | +12 |

FIG. 1

| NUMBER OF CODEWORDS | CDS TABLE 1 | TABLE 2 |
|---|---|---|
| 812 | 0 | 0 |
| 743 | −2 | +2 |
| 423 | −4 | +4 |
| 70 | −6 | +6 |
| 2048 | | |

| NUMBER OF CODEWORDS | CDS TABLE 1 | TABLE 2 |
|---|---|---|
| 812 | 0 | 0 |
| 250 | −2 | +2 |
| 423 | −2 | +4 |
| 70 | −2 | +6 |
| 423 | −4 | +2 |
| 70 | −6 | +2 |

FIG. 4

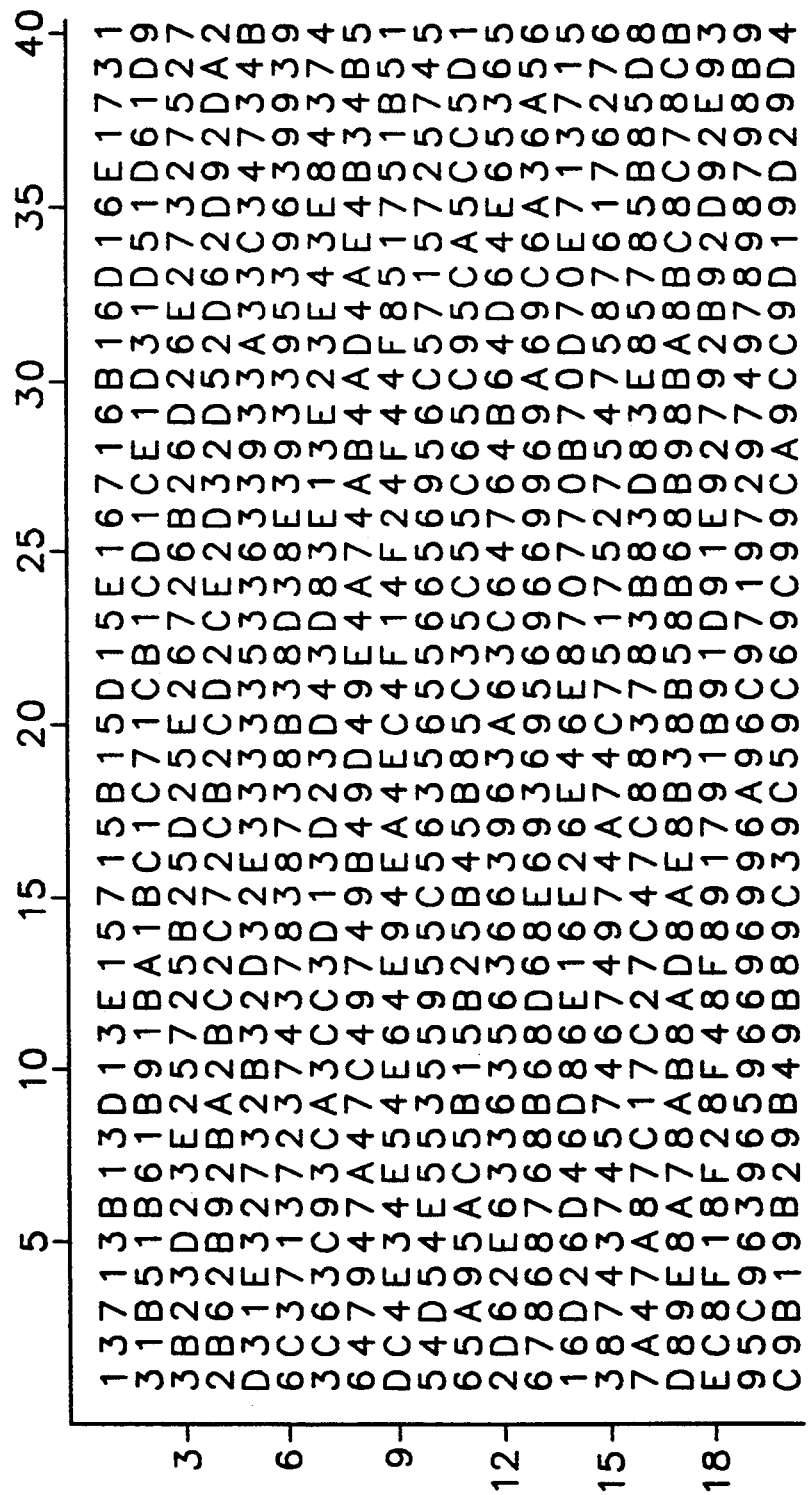

FIG. 5H 9-10 CODE MAP.

| NUMBER OF CODE WORDS | ADDRESS | TABLE 1 DSV | TABLE 2 DSV |
|---|---|---|---|
| 222 | 0–221 | 0 | 0 |
| 100 | 222–321 | –2 | +2 |
| 95 | 322–416 | –2 | +4 |
| 95 | 417–511 | –4 | +2 |

FIG. 8

SIMPLE CODING SCHEME FOR DC FREE CHANNEL CODES OF FORM M/N, WHERE M=N−1 AND M AND N ARE POSITIVE INTEGERS

TECHNICAL FIELD

This invention relates in general to digital data apparatus and more particularly to digital data recording/reproducing apparatus which uses a simple coding scheme for DC free channel codes of the form M/N, where M=N−1 and M and N are positive integers.

BACKGROUND ART

In efforts to achieve DC free recording of data signals, modulation codes of form M/N, where M, N are positive integers, have been employed in magnetic recording systems. The ratio M/N is normally referred to as the code rate. In order to obtain a small coding overhead, larger code rates have been sought after. However, the sizes of practical code rates are usually limited by the memory requirements and/or circuit complexity for encoding and decoding. The larger the value of M, the larger memory and/or circuit complexity is required.

One major drawback in constructing a helical scan magnetic tape recording/ reproducing apparatus is to generate DC free signals. DC free signals are necessary because the input and output signals have to be transferred to and from magnetic tape through a rotary transformer which is generally not responsive to DC signals. Several codes such as the 8/9, 8/10 and 9/10 codes have been proposed to overcome this bottleneck with considerable success. These codes are of form M/N where, 1) M is the number of input or decoded bits, 2) N is the number of output or encoded bits, and 3) both M and N are positive integers. Implementation of these codes usually requires memory elements such as ROMS, RAMS, or PROMS. This somewhat limits the practicality of these codes, especially for applications where light weight and low power recorders are usually indispensable. More specifically, in order to achieve low data overhead, one would expect the values of both M and N to be large. This imposes higher power consumption and larger packaging size. So one desirable feature to achieve is to obtain small memory or memoryless implementations of these codes.

A code is DC free when the digital sum variation (dsv) of any encoded sequence of digital data bits is bounded. The dsv of an encoded sequence may be simply defined as the difference between the number of ones and the number of zeros. When the number of ones is greater than the number of zeros, the dsv is positive (+); when the number of zeros is greater than the number of ones, the dsv is negative (−); and, when the number of ones and zeros are equal, the dsv is zero (0). For convenience, this term shall be used hereafter. The dsv of each codeword is usually called the codeword digital sum (or cds).

In general, an M/N modulation code is defined to be a code that provides one-to-one or one-to-more-than-one mapping of an M bit input sequence into an N bit output sequence. The usual convention calls each group of M input bits an input codeword and each group of N output bits an output codeword. Encoding is a process that provides such a mapping. Decoding is simply a process of accepting the encoded sequence and trying to recover the original input sequence. For convenience, there shall be used in this application the conventional notation (d,k,M,N,r) to signify a run-length limited modulation code where:

d=the minimum number of consecutive zeros between ones k=the maximum number of consecutive zeros between ones M=the number of decoded bits N=the number of encoded bits r =the number of distinct codeword lengths contained within the code.

In addition, the following parameters are defined as follows:

R=code rate=M/N

F=code frequency span=(k+1)/(d+1)

D=code density M*(d+1)/N

In general, in generating an M/N code where M=N−1 and M and N are positive integers, it is desirable to try to achieve the following:

1. To obtain as small a value k as possible and at the same time to obtain as large a value d as possible. This is to achieve a small frequency ratio k+1/d+1 and a large code density. (In case d=0, the code density is identical to the code rate).

2. To achieve a DC free encoded sequence, i.e., to have the dsv value bounded. The value should be bounded to a small value so that low frequency content is low. This is referred to as the dsv range.

3. To achieve a mapping from M to N such that dsv variance is small.

4. To obtain a mapping from M to N that would yield a high percent number of codewords with dsv=0. This is to try to maintain dsv value to zeros.

5. To try to generate an algorithm that would require small digital storage space, minimum circuit complexity, and low power consumption.

SUMMARY OF THE INVENTION

According to the present invention there is provided a new and improved digital data coding scheme which provides a solution to known digital data coding schemes. In general, there is provided a simple coding scheme for DC free modulation codes of the form M/N, where M=N−1 and M and N are positive integers.

According to a preferred embodiment of the present invention there is provided a method of producing a DC free data stream, comprising the steps of:

providing successive input code words of M bits;

encoding each input code word of M bits into an output code word of N bits, where M=N−1 and M and N are positive integers;

wherein the N bit output codeword is selected; (a) to have no more than four 0s or 1s at both sides of said output codeword and no more than seven 0s or 1s in the middle of said output codeword; (b) to have no 01 or 10 patterns; and (c) to have a codeword digital sum (cds) value which does not exceed ±6; and wherein each N bit output codeword has a complementary output codeword which is chosen in order to minimize the overall digital sum variation of the encoded data stream.

DESCRIPTION OF THE DRAWINGS

FIG. 1 is a tabular depiction of the distribution of 11/12 codewords in terms of cds value.

FIG. 2 is a tabular depiction of the distribution of cds values of codewords according to an embodiment of the present invention.

Figure 3C:
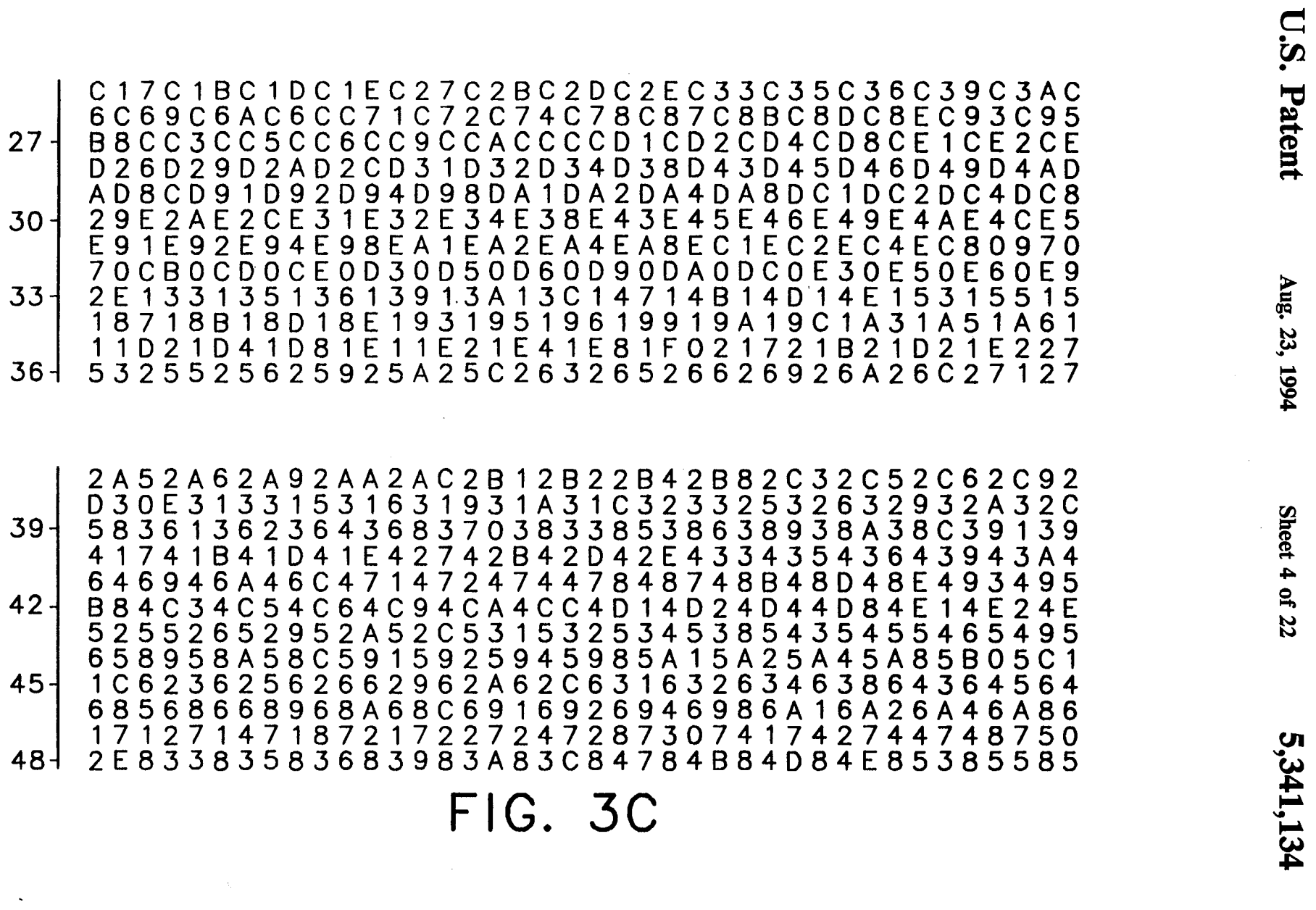
Figure 3D:
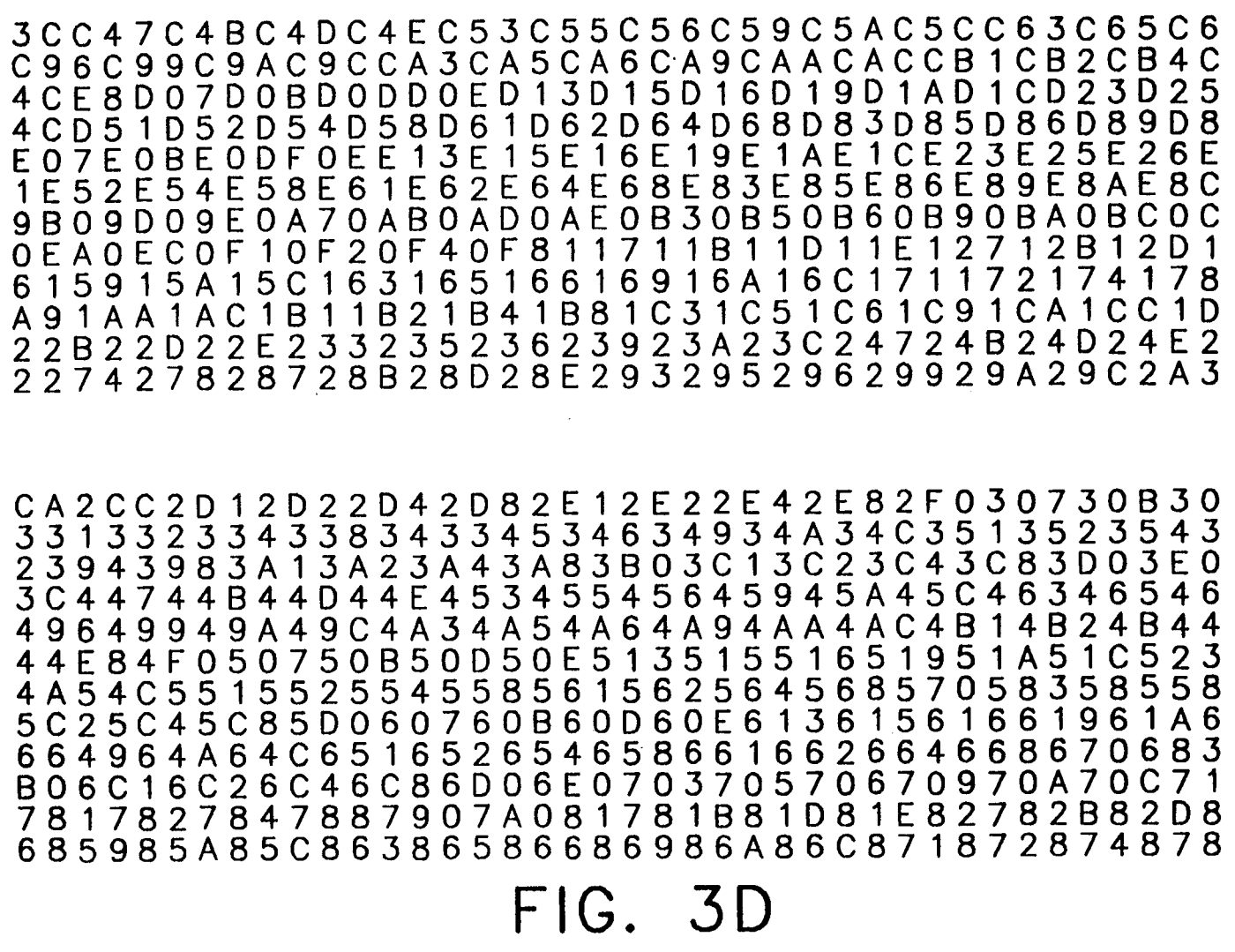
Figure 3E:
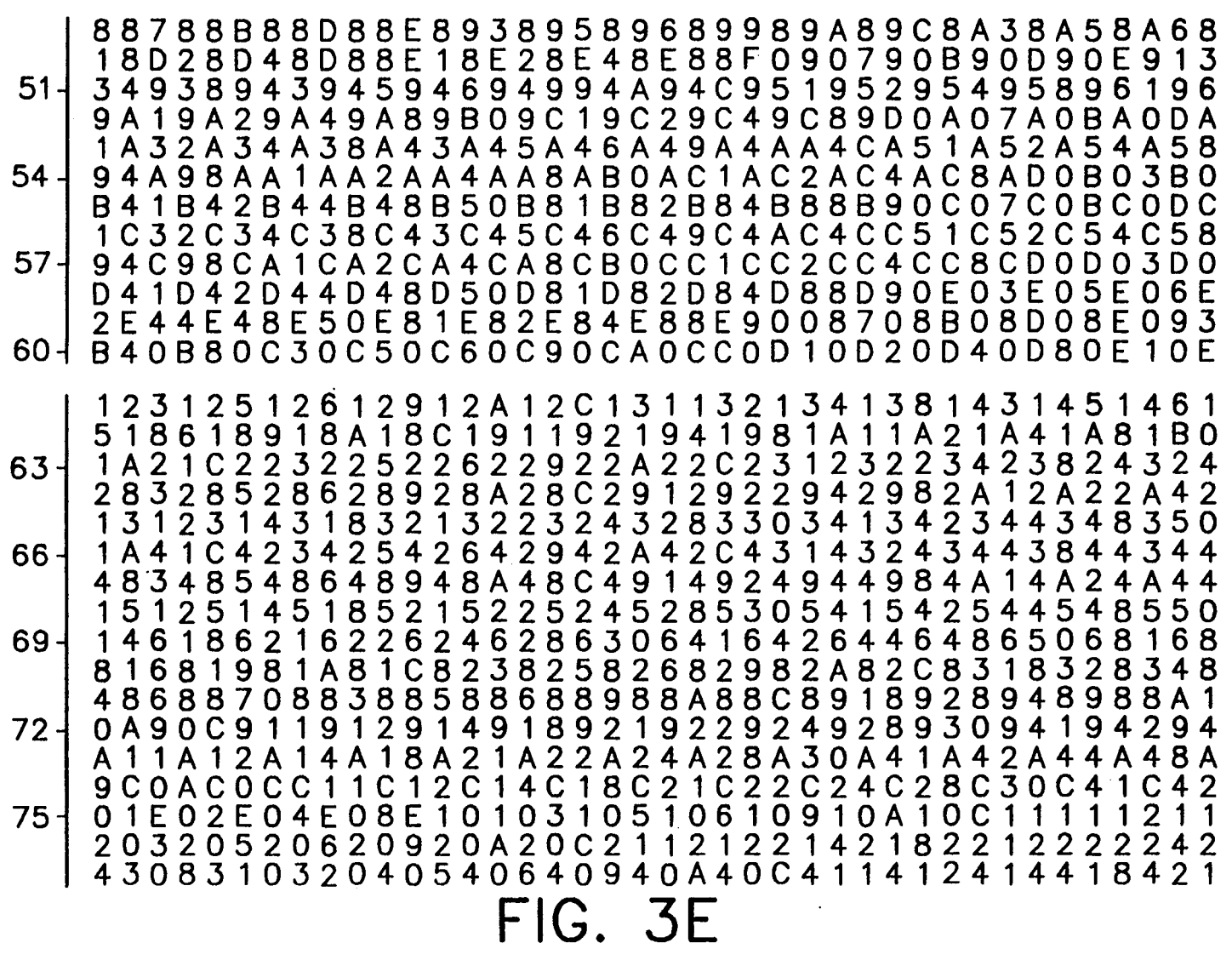

FIGS. 3A to 3F are collectively an 11/12 table listing the code words according to one embodiment of the present invention.

FIG. 4 is a tabular depiction of the distribution of cds values of codewords according to another embodiment of the present invention.

Figure 5B:
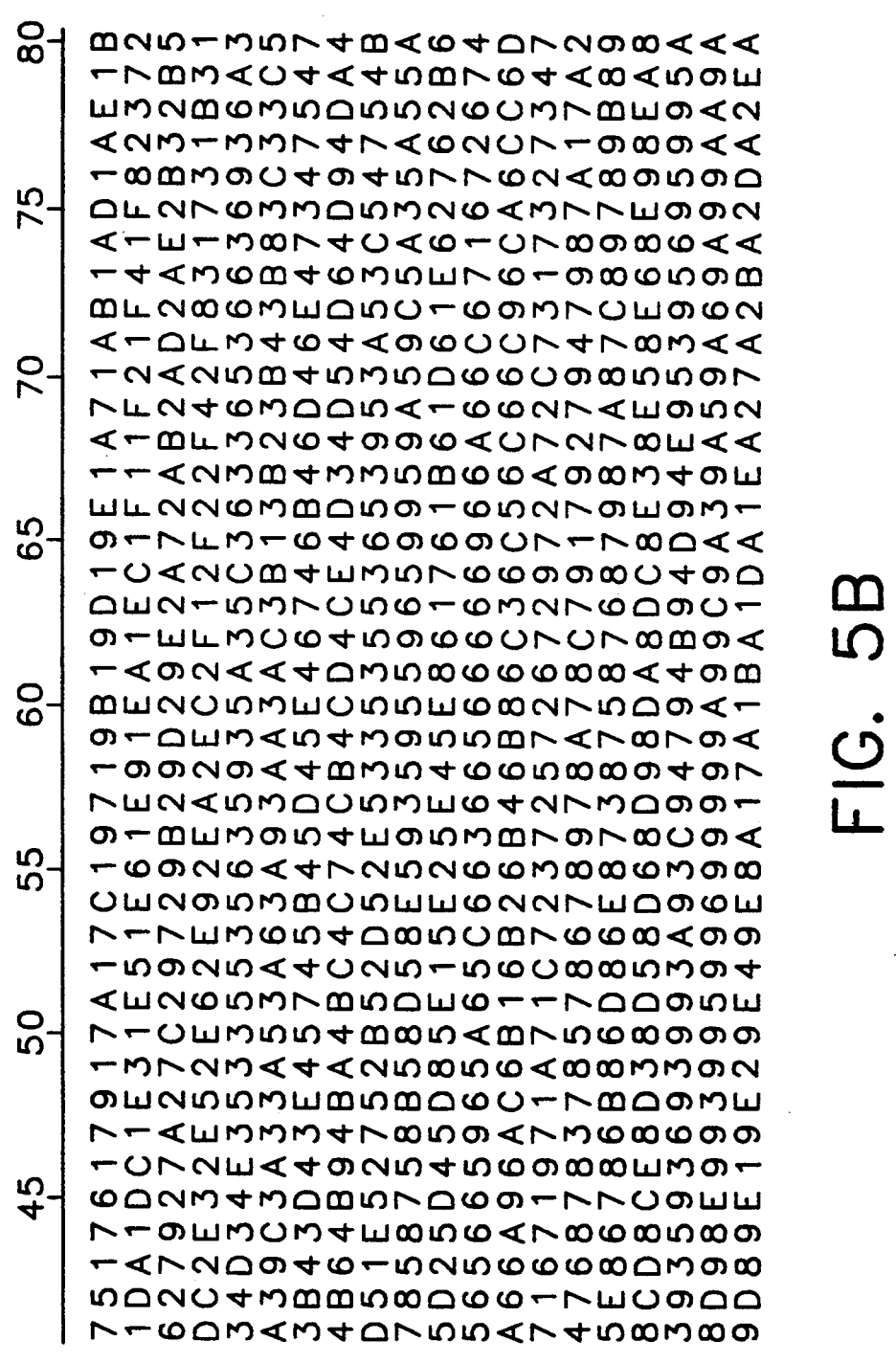
Figure 5C:
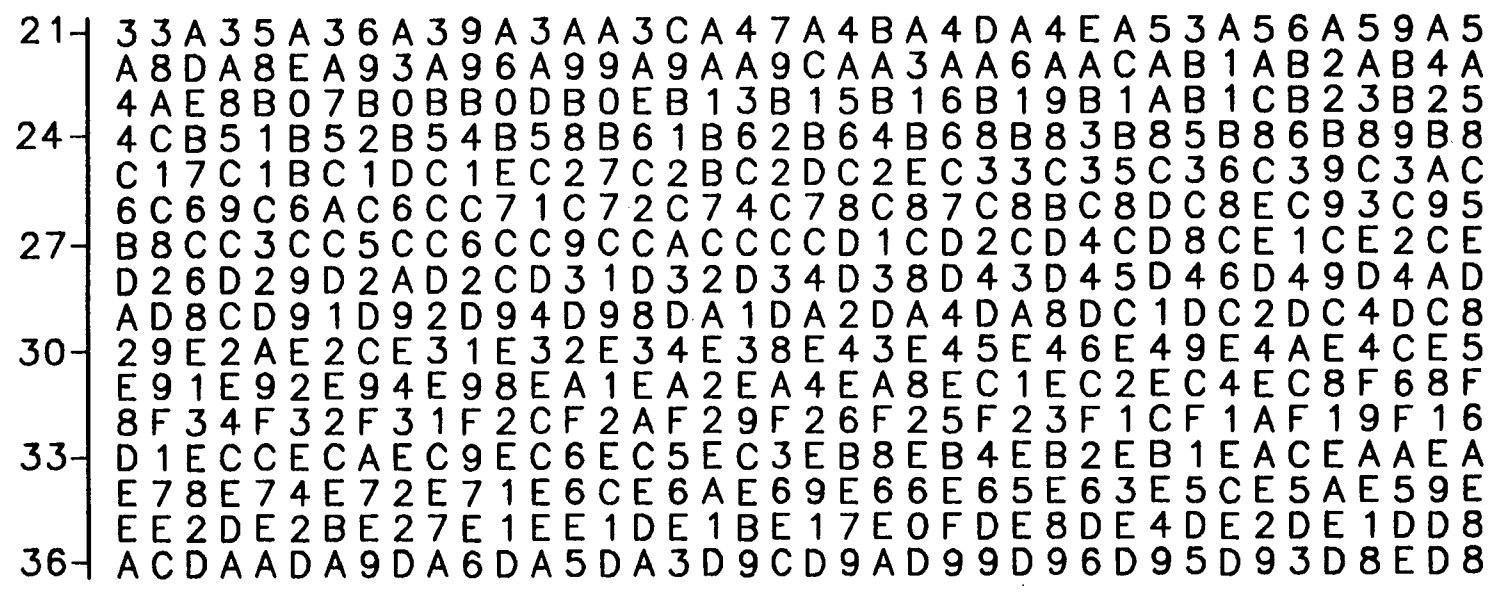
Figure 5D:
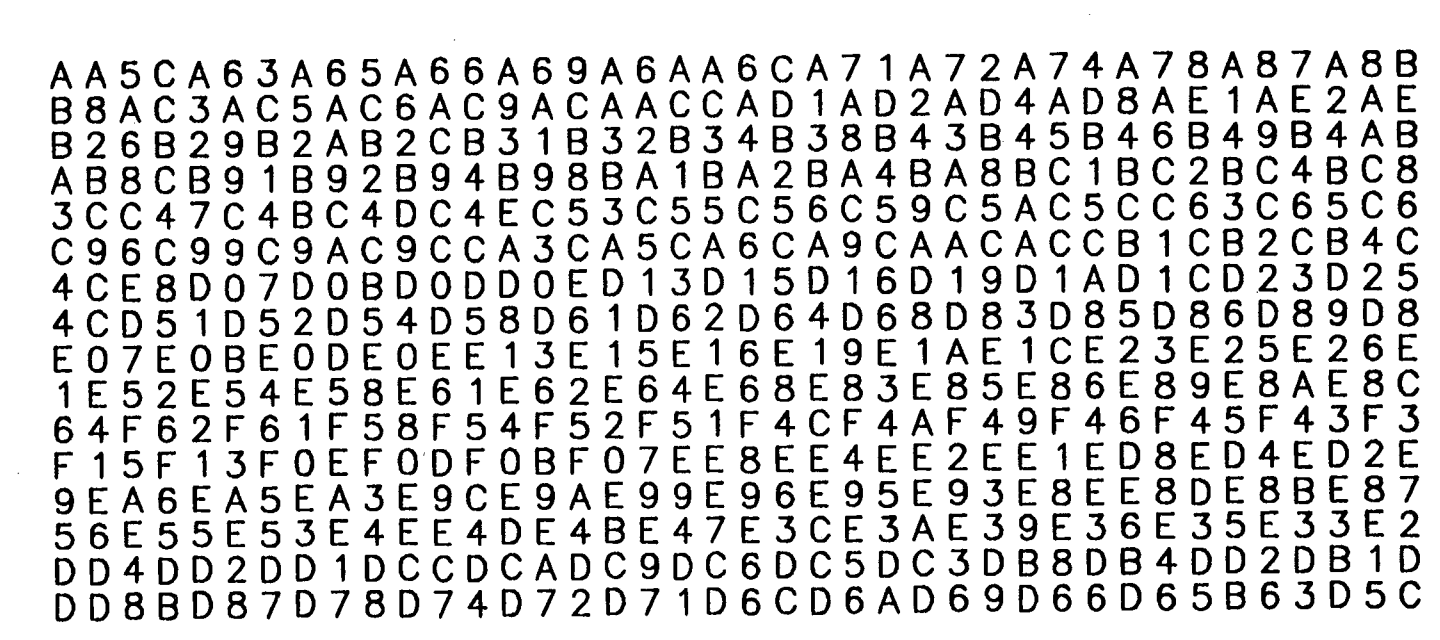
Figure 5E:
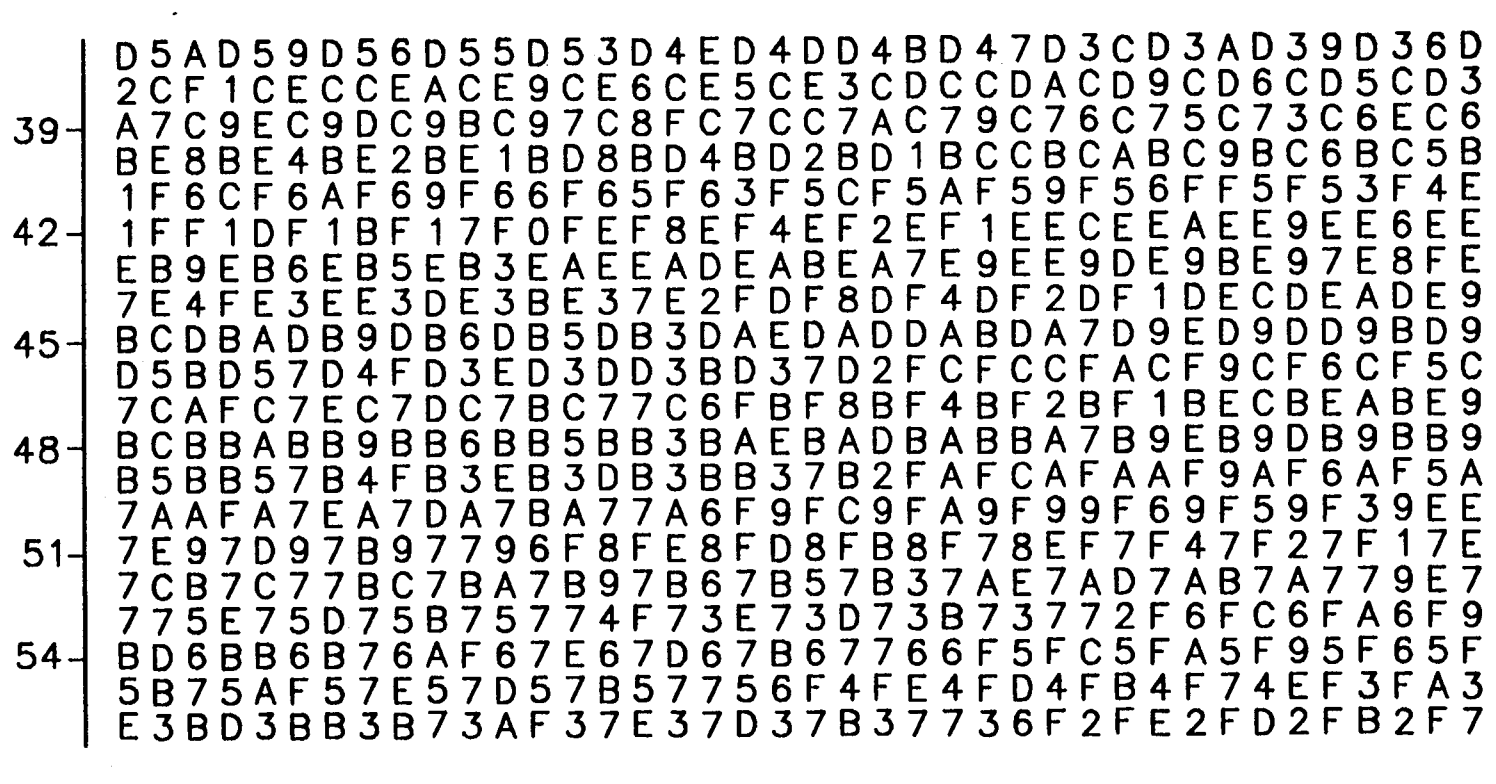
Figure 5G:
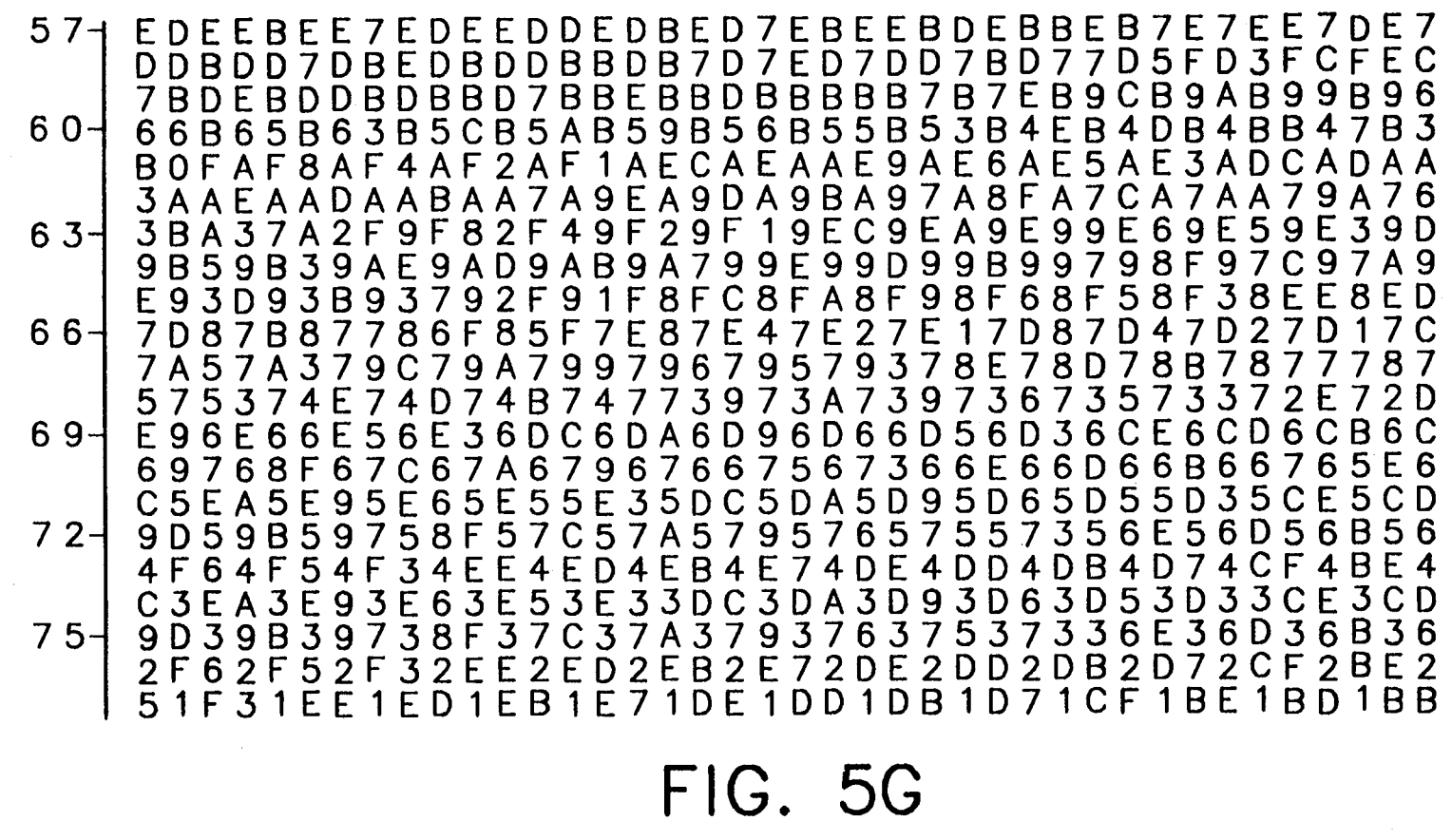
Figure 5H:
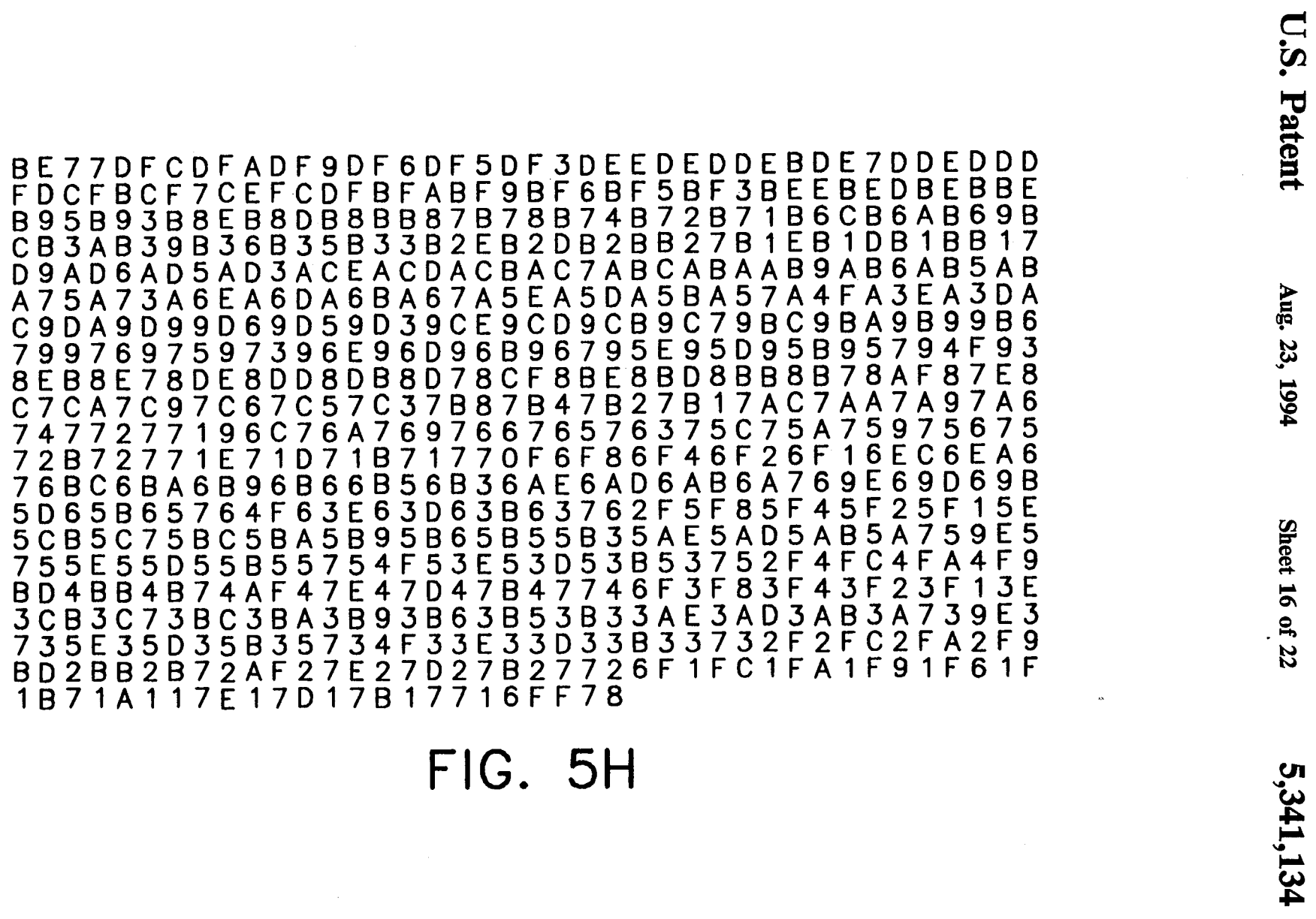

FIGS. 5A to 5H are collectively an 11/12 table listing the code words according to another embodiment of the present invention.

FIG. 8 is a tabular depiction of the distribution of codewords according to another embodiment of the present invention.

DESCRIPTION OF THE PREFERRED EMBODIMENTS

Figure 11:
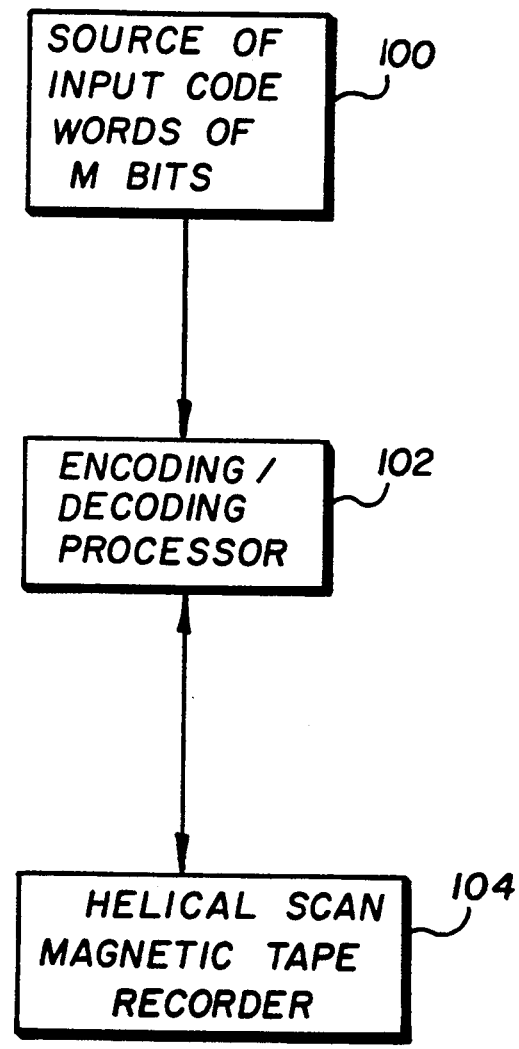
FIG. 11 is a block diagram of apparatus incorporating the method of the present invention.

In order to enhance the understanding and to limit the scope of the discussion of the present invention, the following description shall be based mainly on an 11/12 modulation code. It will be understood, however, that generalization of the procedure may be made to other modulation codes (such as a 9/10 code) of the form M/N (where M=N−1 and M and N are positive integers) by simple modification of the method. Referring to FIG. 11, there is shown a block diagram of apparatus incorporating the method of the present invention. As shown, there is provided a source 100 of input code words of M bits. An encoding/decoding processor 102 encodes and decodes the input code words which are transmitted to and received from a helical scan magnetic tape recorder 104. A more detailed description of preferred embodiments of the encoding and decoding method will be described below.

For a M/N modulation code, where M=N−1, the number of codewords that have "i" 0's or "i" 1's in a codeword is given by:

$$ni = \binom{N}{i} = \frac{N!}{i!(N-i)!}$$

There does not exist a standard assignment procedure of $2^N$ output codewords to $2^M$ input codewords. One specific assignment devised for code (0,3,8,9,1) is described in "Signal and Error-Control Coding", by A. M. Patel, Chapter 5 of *Magnetic Recording*, Vol. II, C. Denis Mee and Eric D. Daniel, 1989. This assignment has the features that it results in a simple implementation and possesses a unique sequence that is not a codeword and is also not part of any code sequence so that it can be used as a synchronization sequence. Another specific assignment is given for code 8/10 in "8/10 Modulation Codes for Digital Magnetic Recording" by S. Fukuda, Y. Kojima, Y. Shimpuku, K. Odaka, IEEE Trans. on Magnetics, Vol/. Mag.-22, No. 5, September, 1986, pp. 1194–1196.

In order to compare various encoding/decoding methods, there is introduced the following common definitions of mean and variance:

Definition 1: It is assumed that each codeword is equally likely to occur in any code sequence. It is also assumed that each dsv value is equally likely to occur. Let n1, n2 . . . be the number of occurrences of codewords with dsv1, dsv2, etc. Then the dsv mean may be defined as:

$$m = \text{mean} = \frac{1}{n} * (dsv1*n1 + dsv2*n2 + \ldots + dsvi*ni)$$

where n=n1+n2+ . . . +ni

Definition 2: The variance of the dsv defined in Definition 1 is given by:

$$\begin{aligned}var &= \frac{1}{n} * \sum_{i=1}^{N} (\text{mean} - dsvi)^2 \\&= \frac{1}{n} * \left[ \sum_{i=1}^{N} (dsvi^2) - 2*\text{mean}* \sum_{i=1}^{N} dsvi + N*\text{mean}^2 \right]\end{aligned}$$

The standard deviation is simply the square root of the variance.

A method for generating an M/N, M=N−1, channel code is to 1) select all usable codewords with zero dsv for one-to-one mapping and 2) select as many codewords with small dsv values as possible for one-to-two mapping. The pair for one-to-two mapping usually has opposite sign cds so that they tend to provide low dsv values. In many instances, codewords which are opposite in sign but equal in value are desirable. So, in general, there are M=n/2 input sequences, where n=[log₂N] and [x] is the smallest integer ≧X. The encoding procedure is then to try to select codewords with cds that will result in a small value of running dsv.

Approach 1: For an 11-12 code, there are $2^{12}=4096$ possible codewords from which $2^{11}=2048$ codewords can be selected for use in the code table. By inspection, one sees that each of 4096 codewords has a bit-wise complement whose cds is equal in magnitude but opposite in sign. It is evident then that if the complement is selected as the alternate choice in one-to-two mappings, then simple techniques for encoding and decoding such code can be devised. These techniques are described below and are implementable in software or hardware. They yield an 11-12 modulation code of form (0,3,11,12,1) with d=0, k=23, and dsv range=±12.

Approach 1, Encoding: Encoding of the M/N Code Using Complementary Code-Word Pairs.

1. Set dsv=0.
2. Get N−1 data bits, stop if end of file.
3. Calculate cds.
4. If cds or dsv=+, tag a 0 to msb of input, set dsv=dsv+cds.
  else tag a 1 to the msb of complemented input, set dsv=dsv−cds.
5. Go to 2.

Approach 1, Decoding: Decoding of the M/N Code Using Complementary Codeword Pairs.

1. Get N bits.
2. If msb=0, take N−1 bits as output else take complemented N−1 bits as output.
3. Go to 1.

Note: "msb"-most significant bit.

Although the above encoding and decoding techniques are simple, their outputs have the following undesirable features: high-cds range and high frequency bandwidth. Since all possible codewords are used in the mapping, the cds range is as high as ±N and the frequency bandwidth can be at its maximum value.

Approach 2: By examining the codewords more closely, one sees that the number of codewords with 12 zeros (or cds=−12) is one, with 11 zeros (or cds=−10) is 12, with 10 zeros (or cds=−8) is 12!/10!*2!=66, etc. This is a binomial expansion. The same may be said about the number of ones. FIG. 1 shows the distribution of 11/12 codewords in terms of cds values. Out of all those possible codewords, not all can be used. Some may be used as synchronization patterns (e.g., 010101010101 or 1010101010); some may be eliminated due to having too many consecutive zeros (e.g.,010000000001) or consecutive ones- (e.g.,111111111100); some must be eliminated due to such undesired features as having too high a cds value- (e.g., 000000000010−cds−10).

One of the features of the present invention is to select as many codewords with small cds values as possible. The process used in doing so is as follows:

1. Eliminate codewords that have large number of consecutive zeros or consecutive ones. (This number is limited to 4 at both sides of a codeword and to 7 in the middle of a codeword).

2. Eliminate codewords with 01 and 10 patterns. They will be used for synchronization patterns.

3. Retain only codewords that have cds value not to exceed ±6.

After eliminating the above undesired codewords, the leftover codewords are depicted in FIG. 2 and the actual codeword look-up table is shown in FIGS. 3A to 3F. The codeword table depicted in FIGS. 3A to 3F is a file of 2048 twelve bit codewords represented in hexadecimal. Each set of three hexadecimal characters represents a twelve bit codeword. The table is made up of 80 columns and 77 rows. By reading the table row by row from left to right, the twelve bit codeword corresponding to an eleven bit data word can be selected. First, the 812 codewords having a cds of 0; next, the 743 codewords having a cds of −2; then, the 423 codewords having a cds of −4; and last the 70 codewords having a cds of −6.

To implement the code in accordance with FIG. 2, only one table of 2048 codewords is needed. This is because the second table can be generated from the first table by simple complementation of the codewords. For example, the codeword 2D8 has cds=−2, while its complement D27 has cds=+2. The encoding and decoding methods used to implement FIG. 2 are similar to those referenced above. Such implementations would yield a code of the form (d,k,m,n,r)=(0,7,11,12,1) with dsv value range ±6 and dsv mean=−0.25 and dsv variance 10.13, and the input cds mean=−0.25 and cds variance=5.57.

Approach 3: The above approaches can be improved further by some simple rearrangement of codeword pairs. This new arrangement is illustrated in FIG. 4. The codeword table is shown in FIGS. 5A to 5H. Again by knowing that each codeword in Table 2 has the complementary codeword in Table 1 with equal magnitude but opposite sign, then the codewords of Table 2 can be derived from Table 1 by simple complementation and translation. This mapping process can be carried out by the method described in FIG. 6. The corresponding decoding method is described in FIG. 7. The above mapping and encoding and decoding methods yield calculated dsv mean=0.57 and dsv variance=3.74 with input cds mean=−0.43 and cds variance=5.37. The dsv range is 2/4 (4 values).

GENERALIZATION OF THE ENCODING/DECODING METHODS

Figure 3A:
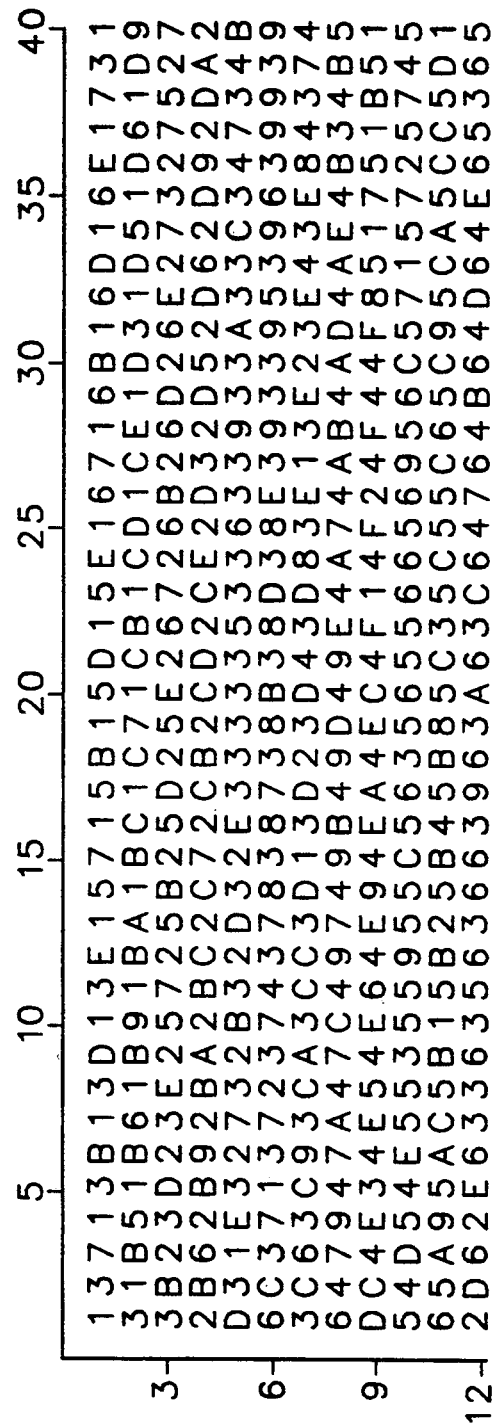
Figure 3B:
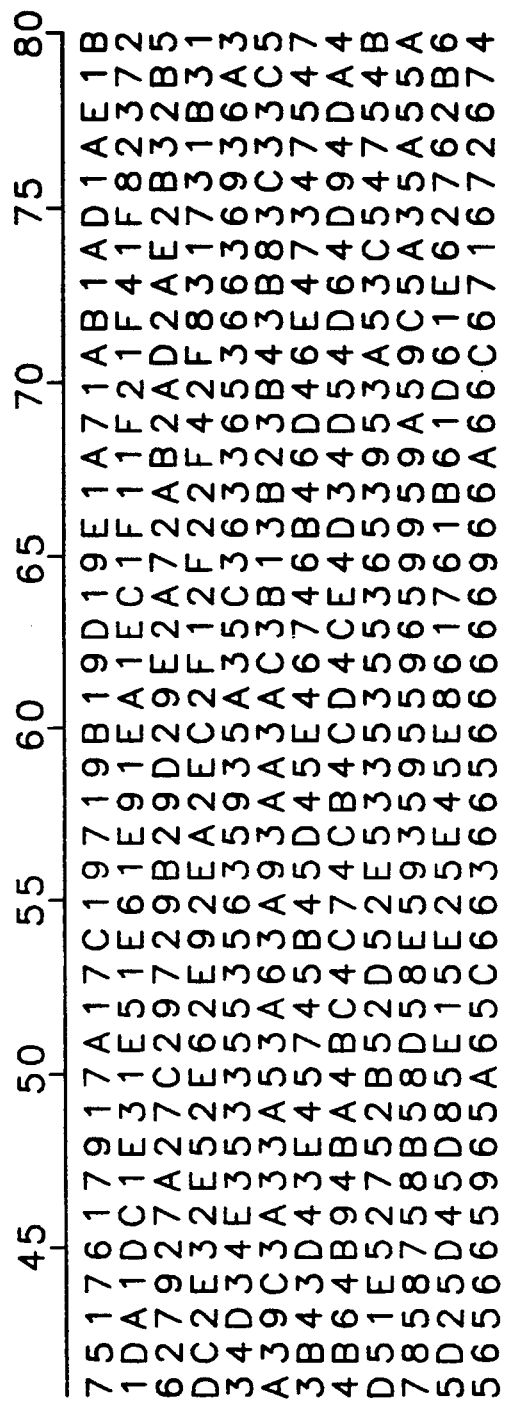
Figure 6:
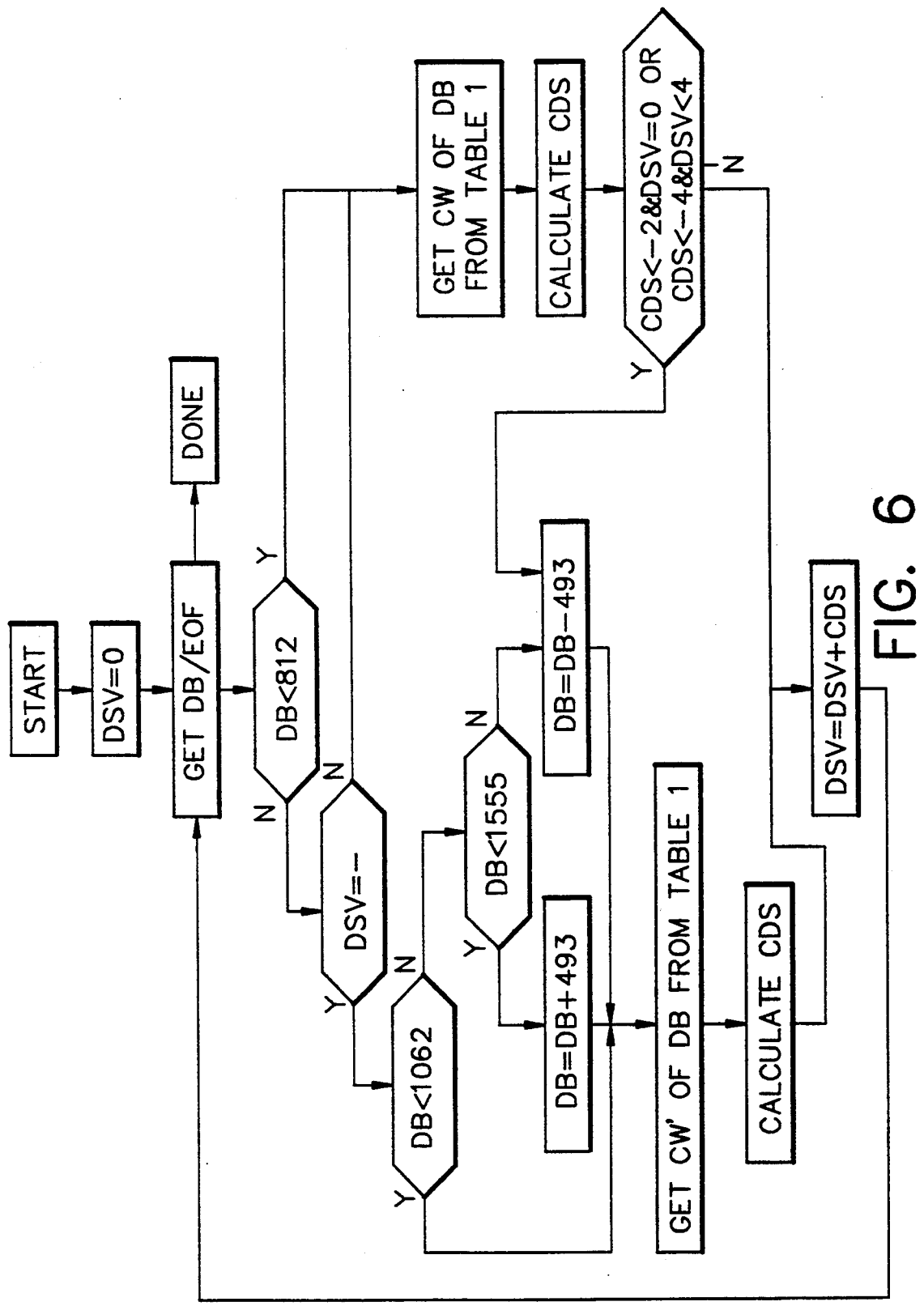
FIGS. 6 and 7 are flow diagrams showing respective methods for encoding and decoding the 11/12 table listing of codewords shown in FIGS. 5A and 5B.
Figure 7:
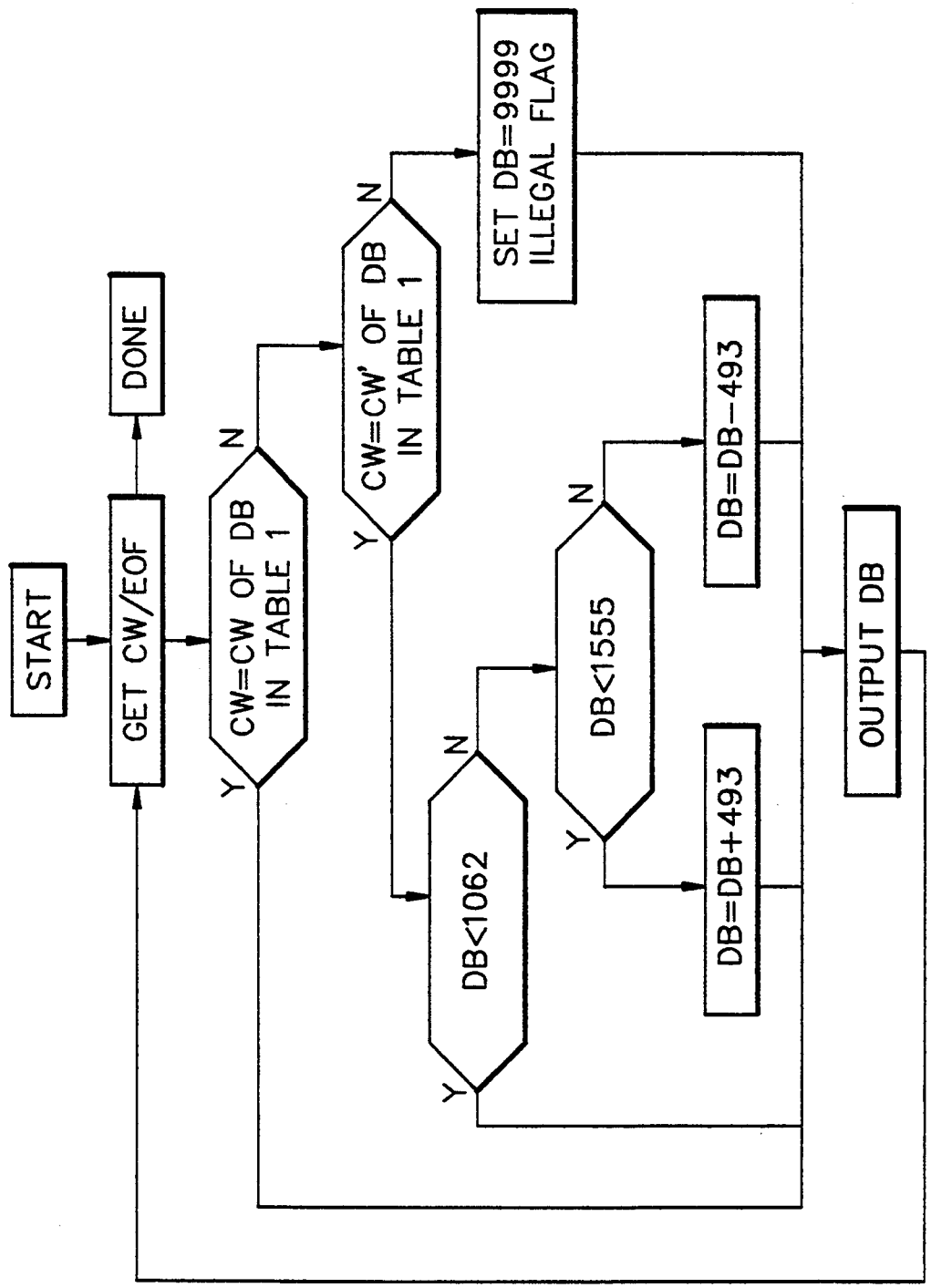
Figure 9:
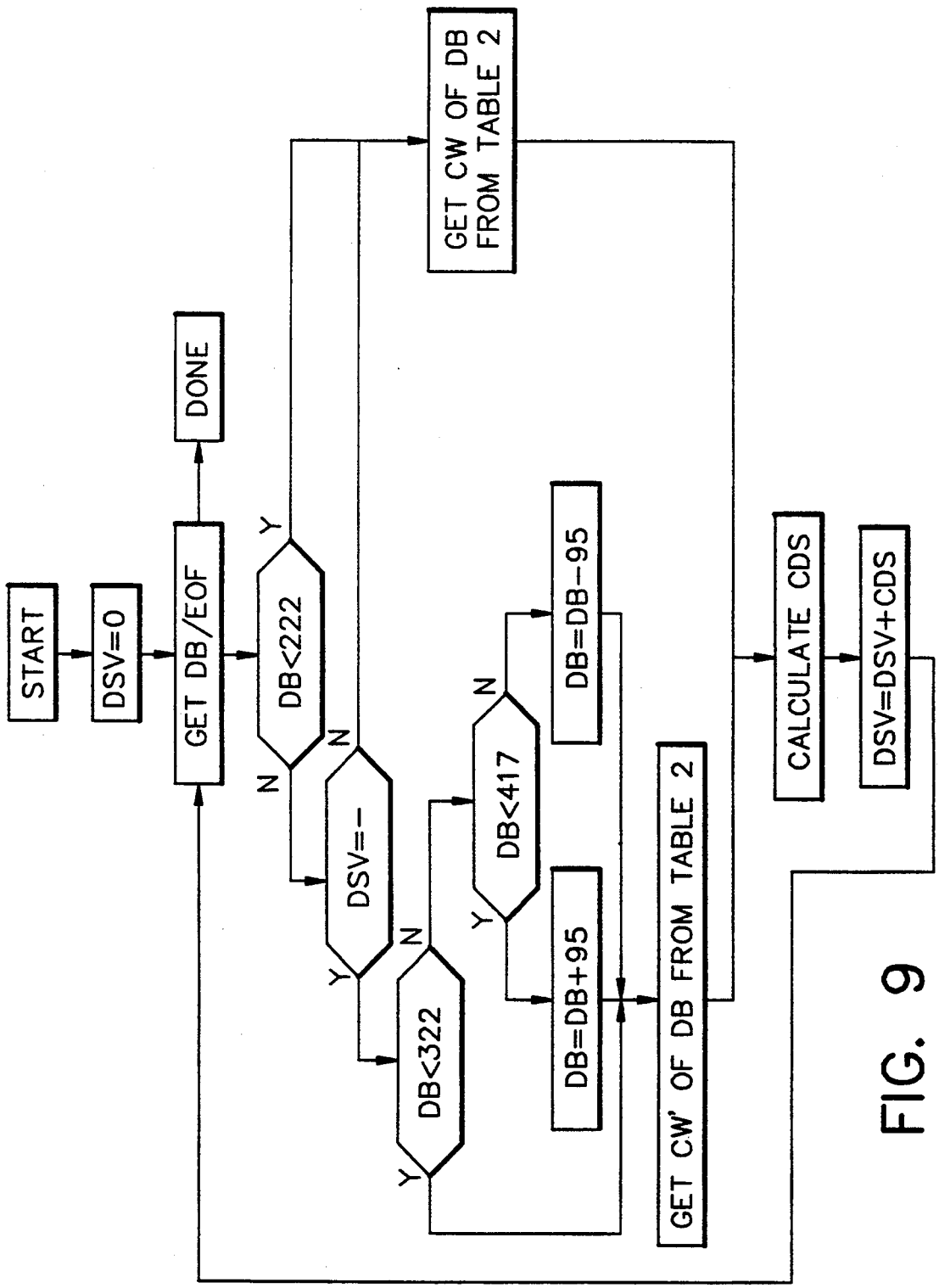
FIGS. 9 and 10 are flow diagrams for encoding and decoding a 9/10 encoding scheme depicted in FIG. 8.
Figure 10:
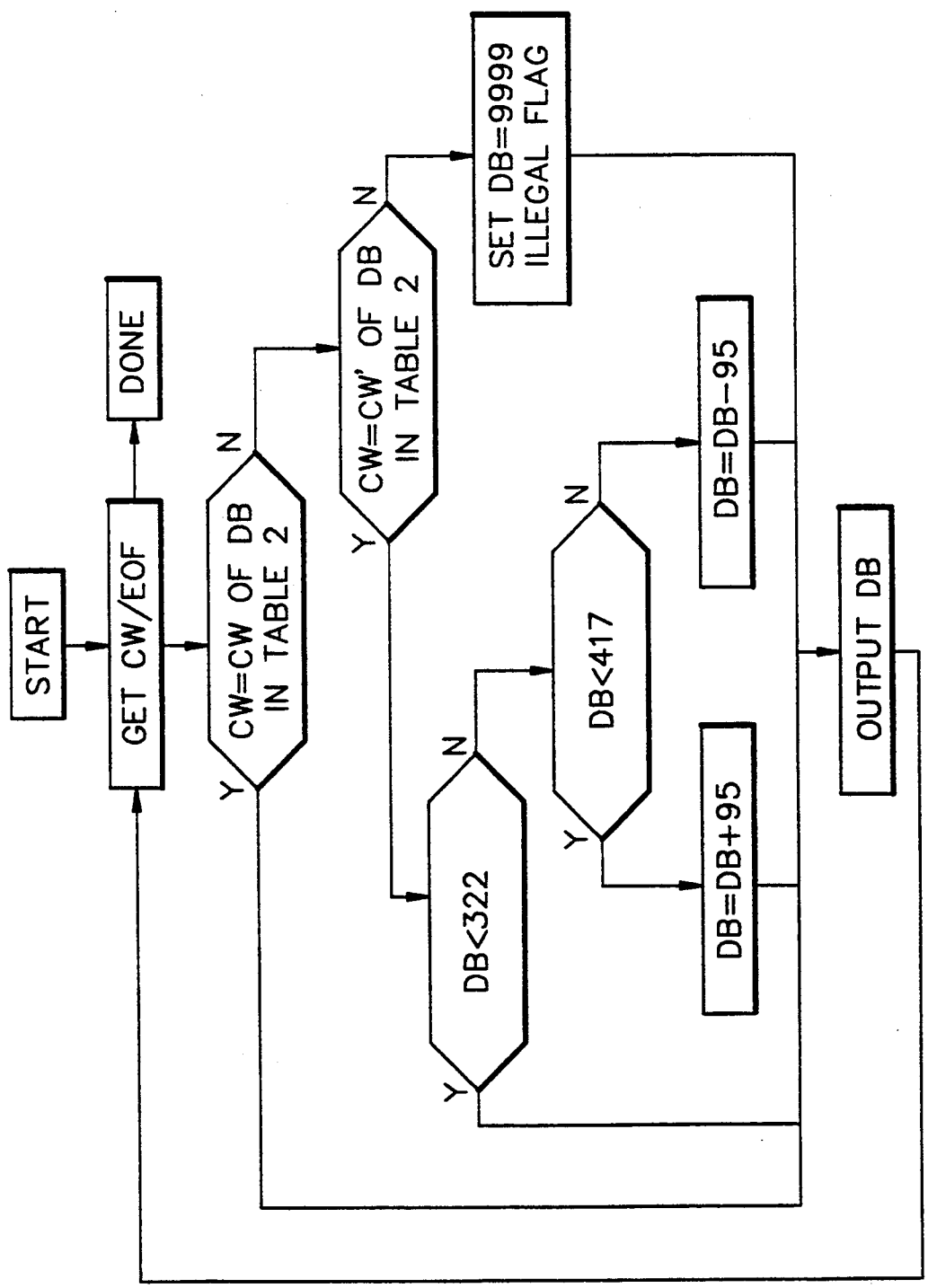

The encoding and decoding methods described in FIGS. 6 and 7 are of a fairly general form. They can be generalized quite readily to other codes of the form M/N, N=M+1 with M and N being positive integers. For practical purposes, we shall generalize the scheme to a 9-10 modulation code. This modulation code is of the form shown in FIG. 8. By employing a similar coding scheme discussed above, it can be implemented using only one table. The encoding and decoding methods described in FIGS. 9 and 10 accomplish this task. Observe that the two sets of methods (FIGS. 6 and 7 and FIGS. 9 and 10) are very similar.

The present invention finds industrial application in magnetic tape recording/reproducing apparatus.

Although the invention has been described with reference to preferred embodiments thereof, it will be understood that variations and modifications can be effected within the spirit and scope of the invention as described above and as defined in the appended claims.

What is claimed is:

1. A method of producing a DC free channel encoded data stream comprising the steps of:
   providing successive input code words of M bits;
   encoding each input code word of M bits into an output codeword of N bits, where M=N−1 and M and N are positive integers;
   wherein the N bit output codeword is selected as follows; (a) to have no more than four 0s or 1s at both sides of said output codeword and no more than seven 0s or 1s in the middle of said output codeword; (b) to have no 01 or 10 patterns; and (c) to have a codeword digital sum (cds) value which does not exceed ±6; and
   wherein, each N bit output codeword has a complementary output codeword which is chosen in order to minimize the overall digital sum variation of the encoded data stream.

2. The method of claim 1 wherein M=11 and N=12, such that said providing step provides successive input codewords of 11 bits, and such that said encoding step, encodes each of said input code word of 11 bits into an output code word of 12 bits.

3. The method of claim 2 wherein said encoding step follows the code described in the table shown in FIGS. 3A and 3B.

4. The method of claim 2 wherein said encoding step follows the code described in the table shown in FIGS. 5A and 5B.

* * * * *